United States Patent [19]
Börnert et al.

[11] Patent Number: 5,977,769
[45] Date of Patent: Nov. 2, 1999

[54] MR METHOD WITH REDUCED MOTION ARTEFACTS

[75] Inventors: Peter Börnert; Markus Weiger; Tobias Schäffter, all of Hamburg, Germany

[73] Assignee: U.S. Philips Corporation, New York, N.Y.

[21] Appl. No.: 08/795,119

[22] Filed: Feb. 7, 1997

[30] Foreign Application Priority Data

Feb. 24, 1996 [DE] Germany .......................... 196 07 023

[51] Int. Cl.⁶ ........................................... G01V 3/00
[52] U.S. Cl. ........................................ 324/306; 324/309
[58] Field of Search ................................ 324/300, 306, 324/307, 309, 314

[56] References Cited

U.S. PATENT DOCUMENTS

| | | | |
|---|---|---|---|
| 4,663,591 | 5/1987 | Pelc et al. | 324/309 |
| 4,682,108 | 7/1987 | Stetter et al. | 324/309 |
| 4,843,322 | 6/1989 | Glover | 324/309 |
| 5,042,485 | 8/1991 | Sano et al. | 128/653 A |
| 5,167,232 | 12/1992 | Parker et al. | 128/653.3 |
| 5,363,844 | 11/1994 | Riederer et al. | 128/653.2 |

FOREIGN PATENT DOCUMENTS 01250234  3/1988  Japan .

OTHER PUBLICATIONS

"Suppression of Respiratory Motion Artifactsi N Manfnetic Resonance Imaging", Michael L. Wood and R. Mark Henelman, Med. Phys. 13 (6) Nov./Dec. 1986, pp. 794–798.

"Real—Time Motion Detection in Spiral MRI Using Navigators" Todd S. Sachs, Craig H. Meyer, Bob S. Hu, Jim Kohli, Dwight G. Nishimura, Albert Macovski, pp. 639–645.

Wood et al., "Suppression of Respiratory Motion Artifacts in Magnetic Resonance Imaging," Med. Phys. 13 (6), pp. 794–798, Dec. 1986.

Sachs et al., "Real–Time Motion Detection in Spiral MRI using navigators", Magnetic Resonance in Medicine, vol. 32, pp. 639–645, 1994.

Liu et al., "A Monitoring, Feedback, and Triggering System for Reproducible Breath–Hold MR Imaging," Mag. Res. in Medicine, vol. 30 pp. 507–511, 1993.

*Primary Examiner*—Louis Arana
*Attorney, Agent, or Firm*—Dwight H. Renfrew, Jr.

[57] ABSTRACT

The invention relates to an MR method with reduced motion artefacts in which the displacement of a pulsating object, or of a part thereof, which is present in an examination zone is continuously measured relative to a reference position, and in which the reconstruction of an MR image utilizes exclusively MR signals acquired from the examination zone while the displacement from the reference position reaches or falls below a threshold value. This gating is enhanced in accordance with the invention in that prior to the acquisition of the MR signals there are generated phase encoding gradients $k_y$) which act on the examination zone with different time integrals and that the threshold value ($v_s$) can be varied in dependence on the respective phase encoding gradient ($k_y$).

17 Claims, 5 Drawing Sheets

MR METHOD WITH REDUCED MOTION ARTEFACTS

BACKGROUND OF THE INVENTION

1. Field of the Invention

The invention relates to an MR METHOD WITH FIELD GRADIENTS SELECTED ACCORDING TO THE DISPLACEMENTS OF AN OBJECT in which the displacement of a pulsating object, or a part thereof, present in an examination zone is continuously measured with respect to a reference position and in which the reconstruction of an MR image utilizes exclusively MR signals acquired from the examination zone while the displacement from the reference position reaches or falls below a threshold value. The invention also relates to an arrangement for carrying out such a method.

2. Description of the Related Art

A method and arrangement of this kind are known from a publication by Sachs et al. in the magazine MRM 33, pp. 639–645 (1994). In the case of prolonged MR (magnetic resonance) examinations, motion artefacts occur notably due to respiratory movements of the patient to be examined. Parts of the body of the patient then perform a reciprocating (pulsating) movement which causes motion artefacts in an MR image reconstructed by means of the MR signals acquired during such examinations.

In the known method the respiratory movement is continuously measured by means of so-called navigator pulses. The reconstruction of an MR image utilizes the MR signals generated in the examination zone while the respiration-induced displacement of the object to be examined (or a part thereof) from a reference position does not exceed a threshold value. According to the known method the examination is performed by means of so-called spiral-MRI, but it can also be carried out in conjunction with other MR sequences.

Figure 1:
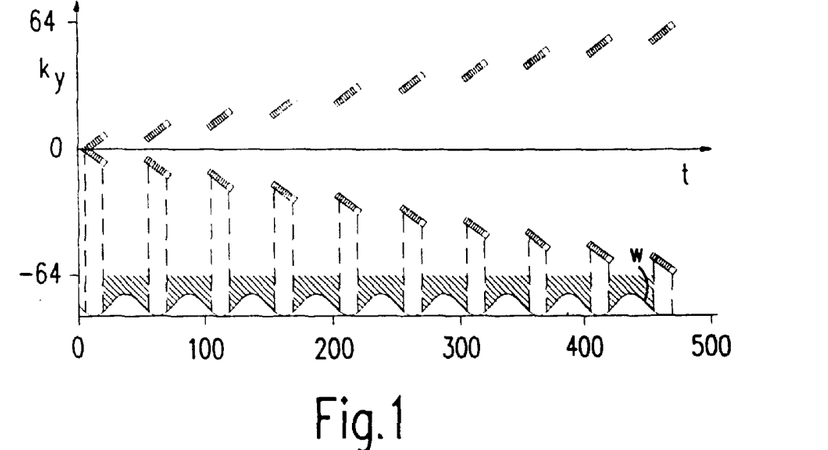
FIG. 1 illustrates the execution in time of the known method.

FIG. 1 shows how MR signals are acquired with different phase encoding according to the known method. Therein, it is assumed that the phase encoding is produced by a magnetic gradient field having a gradient acting in the y-direction and that the MR signals, or the nuclear magnetization in the examination zone, are acquired with a given temporal sequence of the phase encoding or of the time integral over the phase coding gradient (this integral is customarily denoted by the reference $k_y$). Thus, the ordinate represents the relevant $k_y$ value whereas the abscissa represents the time or the number of excitations of the nuclear magnetization in the examination zone, it being assumed that these excitations are repeated after a given period of time (for example, 15 ms). Moreover, below the coordinate there is shown the displacement of the object, or a part thereof, as a function of time. Even though MR signals are generated by continuous excitation according to the known method, not all signals are stored or used for the reconstruction of an MR image. Only when the displacement v drops below a predeterminable threshold value the MR signals generated in the examination zone are acquired and stored while the absolute value of the phase encoding increases. This is represented by small squares in FIG. 1; each square represents a given phase encoding or an MR signal acquired and stored with this phase encoding.

When the displacement exceeds the threshold value, the MR signals occurring are no longer acquired because their processing would cause motion artefacts in the MR image. It is only after a further respiratory period that a state is reached again in which the MR signals, with a different phase coding, can be acquired and stored again. This is repeated for each respiratory period until an MR signal has been acquired and stored for each of the, for example, 128 different $k_y$ values.

Assuming that the body of the patient is for only 25% of each respiratory period in a movement phase w which does not, or not significantly, cause motion artefacts in the MR image, the 128 MR signals required for the reconstruction of an MR image with reduced motion artefacts will have been acquired and stored only after more than 500 excitations of the nuclear magnetization zone. Therefore, in order to reduce the examination time it is known (Wood et al. in the magazine Med. Phys. 13 (6), pp. 794 ff. (1986)) to limit this "gating" either to the high spatial frequencies or to the low spatial frequencies, the best results being offered by the limitation to the gating of the high spatial frequencies.

The "gating" of the MR signals thus prolongs the period of time required for the acquisition of all MR signals. The smaller the displacement from the reference position that is tolerated for the acquisition of the MR signals, the more the movement artefacts will be reduced, but also the longer the examination time will be. Therefore, in this method a compromise must be made between image quality and examination time.

SUMMARY OF THE INVENTION

It is an object of the present invention to conceive an MR method of the kind set forth in such a manner that a more attractive compromise can be made between image quality and examination time. This object is achieved according to the invention in that prior to the acquisition of the MR signals there are generated phase encoding gradients which act on the examination zone with a different time integral, and that the threshold value can be varied in dependence on the relevant phase encoding gradient.

The acquisition according to the invention utilizes MR sequences in which the phase of the nuclear magnetization is phase encoded by activation and deactivation of a magnetic gradient field prior to the acquisition of an MR signal (and subsequent to the excitation of the nuclear magnetization in the examination zone). Such sequences have since long been known, for example as 2DFT or spin warp sequences. The invention is based on the recognition of the fact that the MR signals then contain information to a different extent. The invention utilizes this fact in that the threshold value at which or below which the MR signals are used for the reconstruction of an MR image is varied in dependence on the relevant phase encoding gradient. The MR signals which contain a particularly large amount of information and hence are particularly sensitive to a displacement, can then be acquired at a threshold value which is lower than that used for signals which are less sensitive.

In a first further version of the invention there is provided a given temporal sequence of the phase encoding gradients corresponding to their time integral, said phase encoding gradients being generated and the MR signals subsequently appearing being acquired if the threshold value associated with this time integral is reached or fallen below. In that case the MR signals are acquired and further processed only if the displacement (for example, due to respiration) falls below the threshold value associated with the next phase encoding gradient in the sequence.

In a further, preferred version of the invention the magnitude of the respective next phase encoding gradient is preset in dependence on the relevant displacement measured. Thus, in this case there is no given temporal sequence of the phase encoding gradients. Instead it is determined which phase encoding gradient may be switched at the threshold value given by the respective measured displacement, and this phase encoding gradient is preset before the next MR signal is acquired. The examination time and/or the motion artefacts can thus be significantly reduced in comparison with a method involving a fixed, predetermined sequence of phase encoding gradients. In this version it is possible to repeat an excitation of the nuclear magnetization with a given phase encoding gradient if sufficient time is still available (usually towards the end of the examination time). From among the MR signals acquired with the same phase encoding that MR signal can then be chosen for which the displacement from the reference position was smallest during its acquisition. However, this implies that it is necessary to store not only the MR signal but also the displacement from the reference position at which the relevant MR signal was acquired.

In a further version of the invention, as the integral of the phase encoding gradient increases, the threshold value increases preferably as a cubic function. It has been found that such a variation of the threshold value as a function of the phase encoding or of the integral of the phase encoding gradient offers a particularly attractive compromise.

In a further version of the invention the movement of the object is measured by means of an MR sequence which excites the nuclear magnetization along a line. The movement measurement can then be performed by means of navigator pulses (without phase encoding) as is already known per se from the publication by Sachs et al.

It is important that the reference position on which the measurement of the displacement is based is determined in such a manner that the object remains in this position, or in a small region around this reference position, as long as possible. In a further version of the invention this can be achieved in that during a preparation phase only the pulsating movement of the object, or of a part thereof, is measured and that the position in which the object is most likely present is automatically determined to be the reference position.

An MR device for carrying out the method of the invention includes

- a magnet for generating a uniform, steady magnetic field,
- a gradient coil system for generating a magnetic gradient field,
- at least one RF coil system for generating RF pulses and for receiving MR signals,
- means for forming MR images from the MR signals,
- means for continuously measuring the displacement of a pulsating object, or of a part thereof, present in an examination zone, relative to a reference position,
- a programmable control unit for controlling said means and coil systems, and is constructed so that the control unit can be programmed in such a manner that phase encoding gradients with different time integrals act on the examination zone prior to the acquisition of the MR signals, that the reconstruction of an MR image utilizes exclusively MR signals acquired from the examination zone while the displacement from the reference position reaches or falls below a threshold value, and that the threshold value is varied in dependence on the relevant phase encoding gradient.

BRIEF DESCRIPTION OF THE DRAWING

The invention will be described in detail hereinafter with reference to the drawing. Therein.

DETAILED DESCRIPTION OF THE PREFERRED EMBODIMENTS

Figure 2:
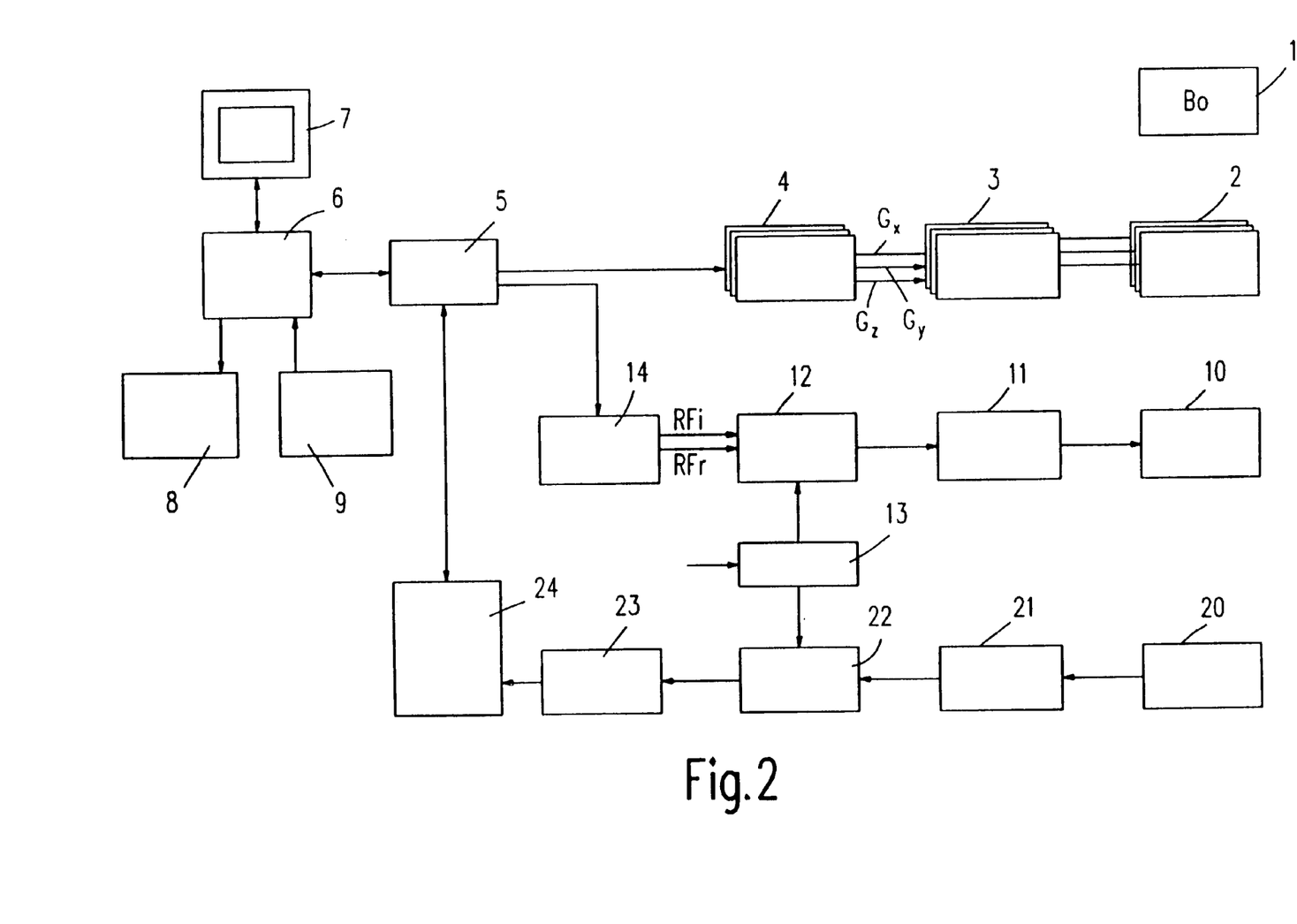
FIG. 2 shows a block diagram of an MR apparatus suitable for carrying out the invention.

The reference numeral 1 in FIG. 2 denotes a diagrammatically shown main field magnet which generates a steady, essentially uniform magnetic field of a strength of, for example 1.5 Tesla which extends in the z-direction in an examination zone (not shown). Also provided is a gradient coil system 2 which is capable of generating magnetic gradient fields $G_x$, $G_y$ and $G_z$ which extend in the z-direction in the examination zone and have a gradient in the x, the y, or the z direction. The gradient coil system 2 is fed by a gradient amplifier 3 device. The variation in time of the magnetic gradient fields is predetermined by a waveform generator device 4 which is controlled by the control unit 5 and which drives gradient amplifier device 3. The control unit 5 cooperates with a workstation 6. The workstation includes a monitor 7 for the display of MR images. Entries can be made via a keyboard 8 or via an interactive input unit 9, for example a light pen.

The nuclear magnetization in the examination zone can be excited by RF pulses from an RF transmitting coil 10 which is connected to an RF amplifier 11 which amplifies the output signals of an RF transmitter 12. In the RF transmitter, the envelopes of an RF pulse are modulated with the carrier oscillations supplied by an RF oscillator 13 whose frequency corresponds to the Larmor frequency (approximately 63 MHz in the case of a main field of 1.5 Tesla). The control unit 5 loads the envelope into a waveform generator 14 which is coupled to the transmitter 12.

The MR signals generated in the examination zone are picked up by a RF receiving coil 20 and amplified by an RF amplifier 21. The amplified MR signal is demodulated in a quadrature demodulator 22 by two 90° offset carrier oscillations of the oscillator, so that in each frequency range two signals are generated which may be considered as the real part and the imaginary part of a complex MR signal. These signals are applied to an analog-to-digital converter 23 which forms MR data therefrom, provided that it is not inhibited by the control unit 5. The MR data is stored in a reconstruction unit 24 which reconstructs, in cooperation with the workstation 6, MR images representing the nuclear magnetization in the examination zone from the MR data derived from a plurality of MR signals.

As will be described in detail hereinafter, the control unit 5 can control the generator device 4 in dependence on the measured movement or displacement of a patient present in the examination zone. If the movement is detected by means of a separate sensor, the sensor must be connected to the control unit; if the movement is determined by way of an MR measurement, the control unit is controlled by the unit 24 which evaluates the MR signals generated during said MR measurement.

Figure 3:
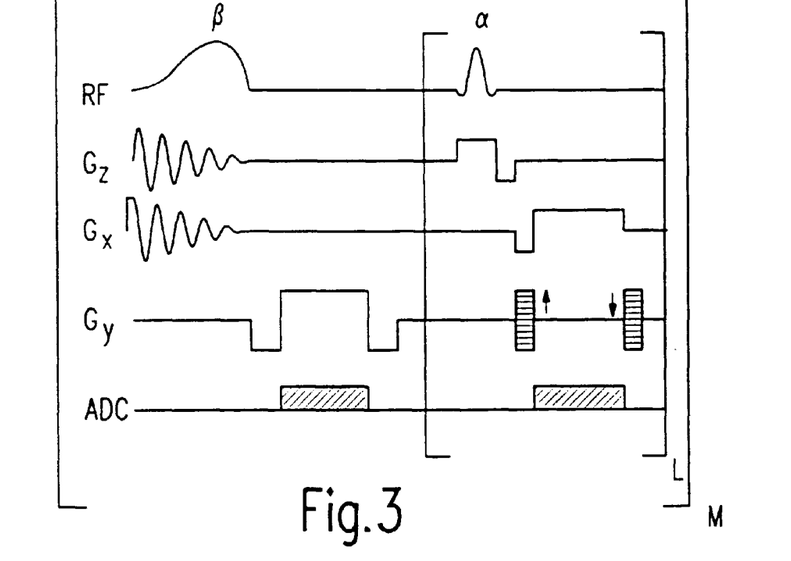
FIG. 3 shows the variation in time of various signals in a sequence suitable for carrying out the invention.

FIG. 3 shows an MR sequence whereby on the one hand the displacement, i.e. the movement of the patient, can be measured and on the other hand MR data can be acquired from a given region of the patient. The sequence includes first of all a two-dimensional RF pulse β (first line) which excites the nuclear magnetization along a line in temporal cooperation with two oscillating magnetic gradient fields (in this case $G_z$ and $G_x$, second and third lines). This line is chosen so that on the one hand it extends as far as possible outside the area of the patient, which is imaged by the actual MR examination and that on the other hand it intersects, for example the diaphragm of the patient as perpendicularly as possible. Thus, in the excited linear region there is generated an MR signal which is read (fifth line) in conjunction with a read gradient, being $G_y$ in this case (fourth line). The nuclear magnetization along the excited line is reconstructed from this MR signal. Because the nuclear magnetization changes comparatively strongly if the line intersects the diaphragm, the movement w of the diaphragm can be deduced therefrom.

Instead of the operation using a two-dimensional RF pulse, the movement can also be measured by excitation of a slice extending perpendicularly to the principal direction of movement of the diaphragm and by derivation of the relevant state of movement from the MR signal acquired therefrom. Such an excitation of a plane slice is simpler than the excitation of pencil beam area by means of a two-dimensional RF pulse, but it cannot always be ensured that this slice does not pass through the area to be imaged during the MR examination, and hence causes artefacts. It is also possible to arrange so-called micro-coils on the surface of the patient's body and to use the MR signals induced therein for the measurement of the relevant phase of movement.

The state of movement of the patient can also be detected by means of other sensors which are not dependent on the magnetic resonance. For example, a respiratory belt can be arranged around the patient's chest, the information concerning the movement being derived from the relative variation of the length of the belt. The advantage of these sensors resides in the fact that the measurement of the movement can be decoupled completely from the actual MR examination. In this case the part of the sequence of FIG. 3 as described thus far could be dispensed with.

Subsequent to the measurement of the state of movement, a slice-selective RF pulse α is generated which rotates the nuclear magnetization through an angle α in a slice extending perpendicularly to the z-direction. The angle α is chosen so that in the steady state an optimum MR signal occurs for the predetermined duration of this sequence (for example, 15 ms). Prior to the acquisition of the MR signal, a magnetic gradient field (in this case $G_y$) is applied during a period of time which is the same for all sequences, its magnitude being varied from one sequence to another so that a given phase encoding, or a given value $k_y$, occurs in the y-direction. The MR signal thus produced is acquired (fifth line) in cooperation with a read gradient ($G_x$, third line), provided that the respiration-imposed displacement, previously measured by means of the navigator pulse β, is sufficiently small. After reading the phase encoding gradient is applied for the same period of time and with the same strength as before, be it with the opposite polarity, so that the phase encoding does not influence the steady state.

Subsequently, the sub-sequence including the MR pulse α is repeated L times, L (for example, 3 or 4) being chosen so that after the L repeats the movement phase will have changed insignificantly only. During these repeats the strength of the phase encoding gradient $G_y$ is changed. After the L repeats of the sub-sequence, the overall sequence shown in FIG. 3 is repeated, i.e. the displacement is measured again, after which four sub-sequences again act on the examination zone. If the movement of the patient is not determined by means of the navigator pulses β (for example, by means of a respiratory belt), the overall sequence consists only of the part commencing with the RF pulse α and is continuously repeated until enough MR data has been obtained.

Figure 4:
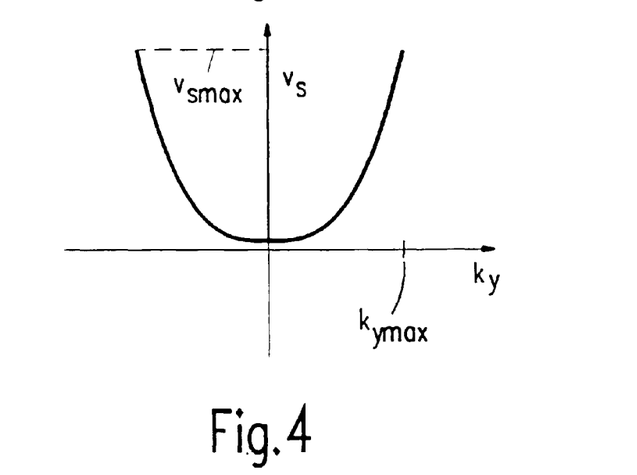
FIG. 4 shows the dependency of the threshold value on the phase encoding.

In accordance with the invention, the threshold value of the displacement of the object with respect to a reference position, at which or below which the MR signal is utilized for the reconstruction of an MR image, is rendered dependent on the phase encoding associated with the relevant MR signal. FIG. 4 shows the dependency of the threshold value $v_s$ as a function of the phase encoding $k_y$. For small values of $k_y$, the threshold value is very small because the MR signals acquired at low values of $k_y$ have an information content which is higher than that of MR signals relating to larger values of $k_y$. From the minimum value $k_y=0$ the threshold value increases to a maximum value $v_{smax}$ for the largest possible phase coding $k_{max}$, preferably as a cubic function.

Figure 5:
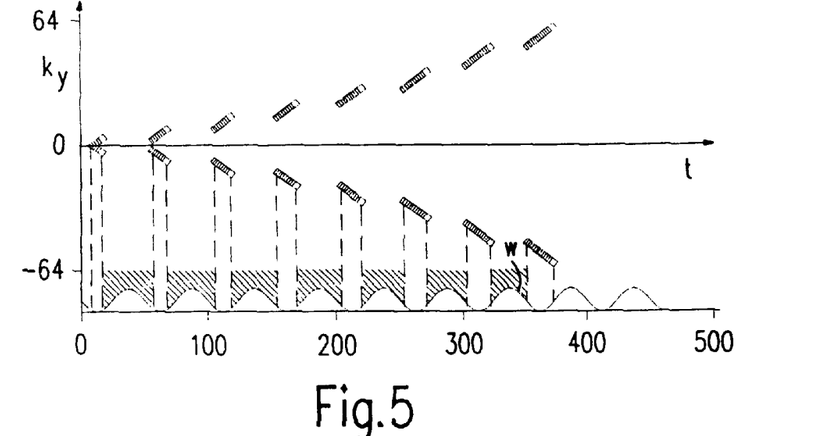
FIG. 5 shows the variation in time of the phase encoding in a first embodiment of the invention.

FIG. 5 illustrates the effects of such acquisition of the MR signals which has been adapted to the movement, the same mode of representation being chosen as in FIG. 1 and it also being assumed that the MR signals are acquired with an increasing magnitude of the phase encoding gradient. Because of the small threshold value for small values of $k_y$, in given circumstances the method according to the invention will require even more time than the method of FIG. 1 until the MR signals associated with small values of $k_y$ have been acquired and stored. As the value of $k_y$ increases, however, the threshold value for the acquisition of the MR signals increases according to FIG. 4, and hence also the period of time within a breathing period in which the MR signals can be acquired and stored, so that the MR signals associated with larger $k_y$ values can be acquired more rapidly than in the known method. Therefore, the overall time required for the acquisition of the MR data required for the same image quality is reduced.

Figure 6:
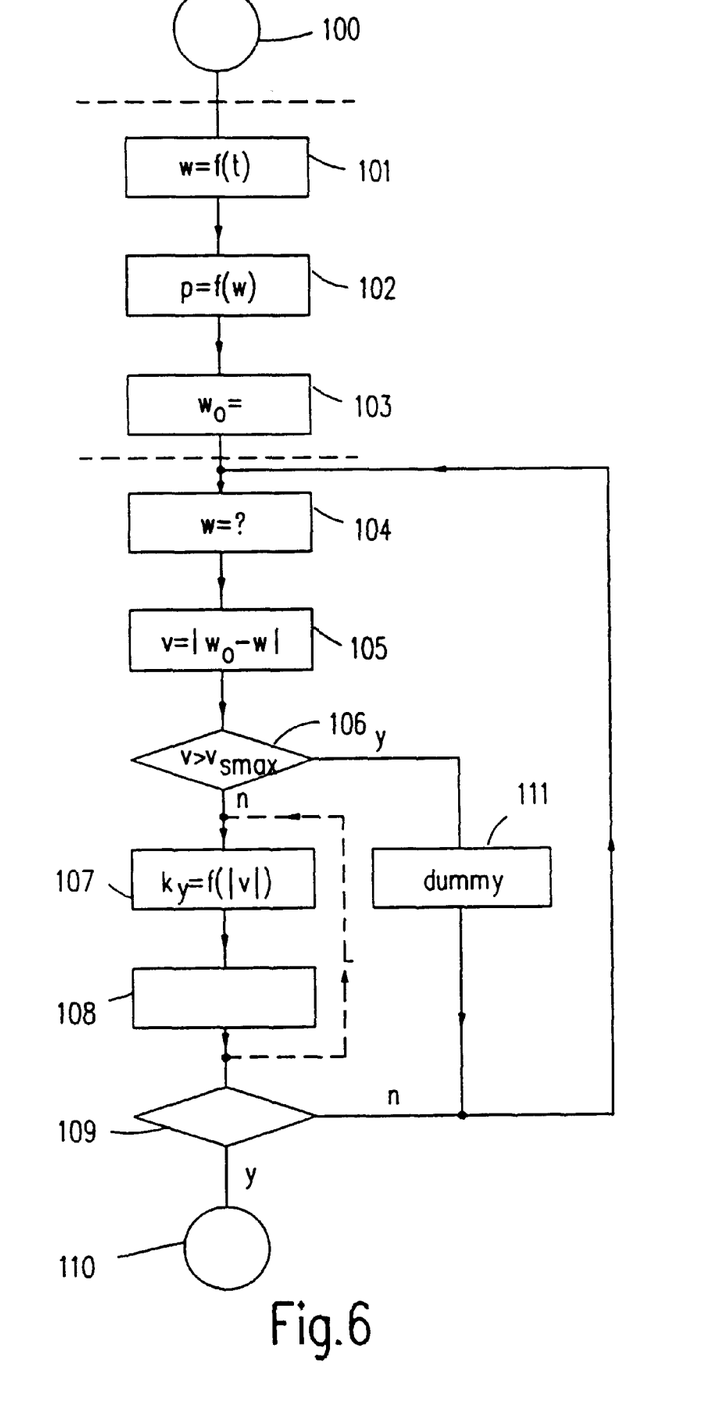
FIG. 6 shows a flow chart illustrating a preferred embodiment of the invention.

A preferred version of the method of the invention will be described in detail hereinafter with reference to the FIGS. 6 to 8. FIG. 6 shows a flow chart which represents the execution of this preferred version. The start (block 100) is succeeded by a preparation phase in which the respiratory movement w is continuously measured (block 101), so that its variation in time is obtained as shown in the FIGS. 1 and 5, be it that therein the acquisition of MR signals is concerned. On the basis of the movement thus measured the probability p of occurrence of the individual movement phases w during this preparation time is determined (block 102).

Figure 7:
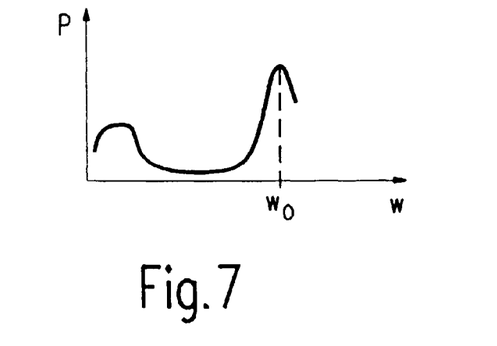
FIG. 7 shows a typical frequency distribution of the individual movement phases of a breathing patient.

FIG. 7 shows a typical variation for a respiratory movement with two probability maxima which occur in the inhaled and the exhaled state, respectively. Generally speaking, after inhalation slightly different values may occur (which is why the associated maximum is wider and lower), whereas after exhalation usually the same value w is reached (which is why the associated maximum is narrower but more pronounced than in the inhalation phase). The value $w_o$ associated with this maximum will be used hereinafter as the reference position (block 103). In principle, however, another value w could also be chosen. However, this value occurs with a lower probability during the respiratory movement, so that the overall measuring times then required would be longer.

The preparation phase has been completed after the steps 101 to 103. Generally speaking, this preparation phase can be interleaved with the other preparation procedures for the MR measurement in such a manner that the overall examination time is not significantly prolonged thereby.

After the fixation of the reference position $w_o$, the instantaneous position w is measured, for example by means of the navigator pulse β shown in FIG. 3 (block 104). Subsequently, the displacement v is calculated (block 105) from the absolute value of the difference between the reference position $w_o$ and the actual position w. It is then checked whether the calculated value v is larger than the maximum threshold value $v_{smax}$ (block 106). If this is not the case, in block 107 a phase coding not generated thus far is determined which is still permissible for this displacement according to FIG. 4, said phase coding being given for the subsequent sub-sequence (right half of FIG. 3). The MR signal generated is detected and stored and is available for the reconstruction of an MR image. The steps 107 and 108 are repeated L times, for example three or four times, as denoted by dashed lines. Subsequently, a further interrogation takes place (block 109) in order to check whether all values of $k_y$ have been measured. If this is the case, the acquisition of the MR signals is terminated (block 110).

If it appears in block 106 that the displacement v exceeds the maximum threshold value $v_{smax}$, the sub-sequence shown in the right half of FIG. 3 can be generated, (block 111), however, without digitization and storage of the MR signal occurring. By generating such a "dummy" sequence, the steady state of the nuclear magnetization as mentioned in conjunction with FIG. 3 is sustained. However, if the value v is substantially larger than $v_{smax}$, generation of this dummy sequence could also be omitted; the generating of the dummy sequences should then be started again only when the value v approaches the maximum threshold value $v_{smax}$.

If it is established in the block 106 that the displacement is below the maximum threshold value and that MR signals have already been acquired for all values $k_y$ still permissible for the relevant displacement, two possibilities exist:

a) An MR signal is acquired and stored again for one $k_y$ value. During the subsequent reconstruction that one of the MR signals stored for this $k_y$ value is used which is associated with a smaller displacement v. This implies that not only the MR signal is stored but also the associated displacement v.

b) A dummy sequence is generated. If it is determined in the block 109 that not yet all required MR signals have been acquired, or a dummy sequence has been generated, the loop consisting of the blocks 104 . . . 111 is completed again until all necessary MR signals have been acquired and stored.

If the steps 107 and 109 cannot be performed sufficiently rapidly in an MR system, it is also possible to calculate in advance the displacement v, reached after a given delay of, for example 100 ms, on the basis of the displacement measured and the movement determined during the preparation phase. The steps 106 . . . 111 are then performed in dependence on the precalculated displacement v after the given delay.

Figure 8:
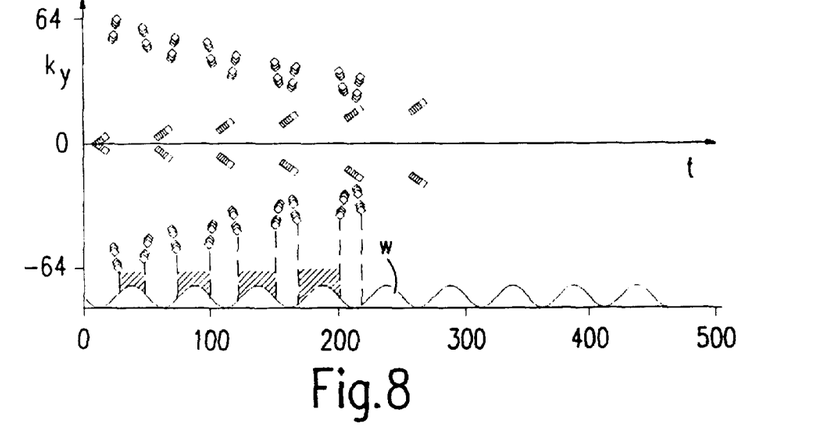
FIG. 8 shows the execution in time in the preferred embodiment.
Figure 9:
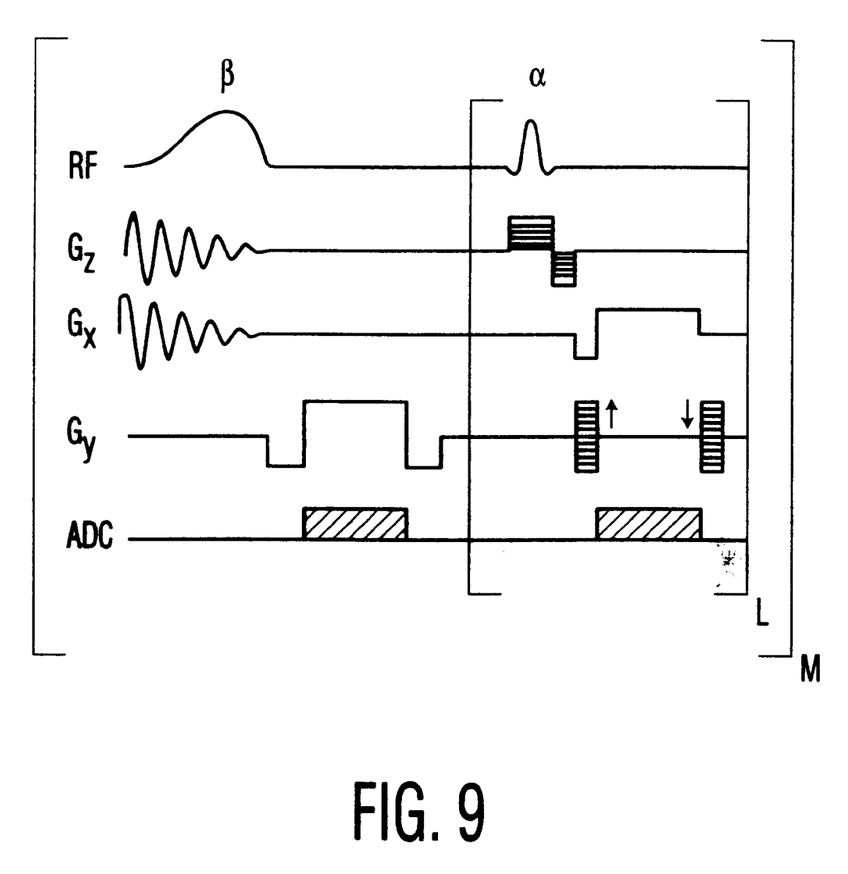
FIG. 9 shows the variation in time of various signals in a sequence suitable for excitation of a plurality of slices.

FIG. 8 illustrates, in the same way as the FIGS. 1 and 5, the possibilities of the MR method described with reference to FIG. 6. It can be seen that MR signals with a large $k_y$ value are acquired already in the case of comparatively large displacements. It is only in a comparatively small period of time in which the displacement becomes very large that no MR signals are further processed. The smaller the displacement v becomes during the further process, the lower the value $k_y$ will be at which the MR signals are acquired. During the next respiratory period the interval during which no MR signals are acquired for further processing is already somewhat larger, because most MR signals for high $k_y$ values have already been acquired during the preceding sequence. If desired, however, these sequences can also be repeated as explained in conjunction with FIG. 6. A complete data set will then have been acquired already after a comparatively small number of respiratory periods.

For the sake of simplicity of illustration the invention has been described in conjunction with an MR method for generating an MR image of a two-dimensional area, being the slice excited by the RF pulse α (FIG. 3). The patients can hold their breath for a few seconds in most cases; this period of time suffices to acquire 128 or even 256 MR signals with different phase coding in the case of a two-dimensional MR method with a repetition time of, for example 15 ms. In the case of three-dimensional methods it is not possible to hold the breath for such a long time and, therefore, the invention is especially advantageous for such methods. A suitable three-dimensional method is, for example the so-called 3DFT method in which the phase is encoded not only in the y-direction but also in one further direction. The invention, however, can also be used for three-dimensional methods where the phase coding described with reference to FIG. 3 takes place in one direction only, whereas the MR information for the plane extending perpendicularly thereto can be acquired by means of a different method, for example Turbo Spin Echo (TSE), GRASE or segmented EPI. According to these methods information which is uniformly distributed across the k space is acquired after each excitation, so that it does not make sense to assign a different threshold value of the movement to each excitation. However, if the phase encoding can take place in the described manner in the direction perpendicular thereto, the method according to the invention can be readily carried out.

The invention can also be used in conjunction with multi-slice methods in which a plurality of slices are successively excited. In that case it may be useful to preset, in dependence on the relevant displacement measured, the next slice to be excited, i.e. the slice selection gradient, instead of the next phase encoding gradient. In that case MR signals are always acquired in the same movement phase for each slice, the movement phases for two different slices then deviating from one another. Within the individual slices, however, only slight displacements occur and hence only insignificant motion artefacts.

We claim:

1. An MR method with reduced motion artefacts comprising
measuring continuously the displacement of a pulsating object, or a part thereof, present in an examination zone with respect to a reference position,
generating phase encoding gradients which act on the examination zone with different time integrals, and
reconstructing an MR image exclusively from MR signals acquired from the examination zone only if the measured displacement from the reference position reaches or falls below a threshold value of the displacement, wherein the threshold value of the displacement is varied during said reconstruction in dependence on the time integral of the relevent phase encoding gradient in a manner which is increasing and continuous.

2. An MR method as claimed in claim 1, characterized in that there is provided a given temporal sequence of the phase encoding gradients corresponding to their time integral, said phase encoding gradients being generated and the MR signals subsequently appearing being acquired only if the measured displacement reaches or falls below the threshold value of the displacement associated with this time integral.

3. An MR method as claimed in claim 2, characterized in that the movement of the object is measured by means of an MR sequence which excites the nuclear magnetization along a line.

4. An MR method as claimed in claim 2, characterized in that as the integral of the phase encoding gradient increases the threshold value of the displacement increases as a cubic function.

5. An MR method as claimed in claim 4, characterized in that the movement of the object is measured by means of an MR sequence which excites the nuclear magnetization along a line.

6. An MR method as claimed in claim 1, characterized in that the magnitude of the respective next phase encoding gradient is preset in dependence on the relevant displacement measured.

7. An MR method as claimed in claim 6, characterized in that the movement of the object is measured by means of an MR sequence which excites the nuclear magnetization along a line.

8. The method of claim 6 wherein the magnitude of the respective next phase encoding gradient is preset to any value for which the associated threshold is greater than or equal to the relevant displacement measured.

9. An MR method as claimed in claim 6, characterized in that as the integral of the phase encoding gradient increases the threshold value of the displacement increases as a cubic function.

10. An MR method as claimed in claim 9, characterized in that the movement of the object is measured by means of an MR sequence which excites the nuclear magnetization along a line.

11. An MR method as claimed in claim 1, characterized in that as the integral of the phase encoding gradient increases the threshold value of the displacement increases as a cubic function.

12. An MR method as claimed in claim 11, characterized in that the movement of the object is measured by means of an MR sequence which excites the nuclear magnetization along a line.

13. An MR method as claimed in claim 1, characterized in that the movement of the object is measured by means of an MR sequence which excites the nuclear magnetization along a line.

14. An MR method as claimed in claim 1, characterized in that during a preparation phase only the pulsating movement of the object, or of a part thereof, is measured and that the position in which the object is present for the longest period of time is automatically determined to be the reference position.

15. The method of claim 1 wherein as the integral of the phase encoding gradient increases the threshold value increases.

16. An MR device for imaging a pulsating object in an examination zone comprising:

a magnet for generating a uniform, steady magnetic field in the examination zone, a gradient coil system for generating magnetic gradient fields in the examination zone, the magnetic gradient fields including a phase encoding gradient field, at least one RF coil system for generating RF pulses in and for receiving MR signals from the examination zone, means for reconstructing MR images from the MR signals received from the examination zone, means for continuously measuring the displacement of a pulsating object, or of a part thereof, present in the examination zone, relative to a reference position a programmable control unit for controlling said means for reconstructing and said coil systems in a manner responsive to the measured displacement, wherein the control unit is programmed in such a manner that phase encoding gradients with different time integrals act on the examination zone prior to the acquisition of the MR signals, wherein the reconstruction of an MR image utilizes exclusively the MR signals acquired from the examination zones only if the measured displacement from the reference position reaches or falls below a threshold value of the displacement, and wherein the threshold value of the displacement is varied in dependence on the time integral of the relevant phase encoding gradient in a manner which is increasing and continuous.

17. An MR method with reduced motion artefacts in which the displacement of a pulsating object, or a part thereof, present in an examination zone is continuously measured with respect to a reference position, and in which the reconstruction of an MR image utilizes exclusively MR signals acquired from the examination zone only if the measured displacement from the reference position reaches or falls below a threshold value of the displacement, wherein prior to the acquisition of the MR signals there are generated phase encoding gradients which act on the examination zone with a different time integral, wherein the threshold value of the displacement is varied continuously in dependence on the relevant phase encoding gradient, and wherein the time integral of the next phase encoding gradient is set to any value for which the associated threshold is greater than or equal to measured displacement.

* * * * *